US006603710B1

(12) United States Patent
Pantet et al.

(10) Patent No.: US 6,603,710 B1
(45) Date of Patent: Aug. 5, 2003

(54) METHOD FOR MAKING A DISPLAY MODULE INCLUDING A LIQUID CRYSTAL AND A SINGLE-FACE PRINTED CIRCUIT, AND MODULE OBTAINED VIA SAID METHOD

(75) Inventors: Laurent Pantet, St-Imier (CH); Carlo Albisetti, Courtelary (CH)

(73) Assignee: The Swatch Group Management Services AG, Biel (CH)

( * ) Notice: Subject to any disclaimer, the term of this patent is extended or adjusted under 35 U.S.C. 154(b) by 0 days.

(21) Appl. No.: 09/645,328

(22) Filed: Aug. 25, 2000

(30) Foreign Application Priority Data

Aug. 27, 1999 (CH) .............................. 1570/99

(51) Int. Cl.⁷ ...................... G04G 17/00; H05K 1/15
(52) U.S. Cl. .................. 368/84; 368/242; 349/191; 349/67; 439/6; 361/749
(58) Field of Search .................. 368/82, 84, 88, 368/239, 242; 349/67, 58, 149, 62, 64, 65, 151; 228/105; 151/152; 439/67, 66; 361/748, 749; 29/592, 592.1, 729, 739

(56) References Cited

U.S. PATENT DOCUMENTS

| | | | | |
|---|---|---|---|---|
| 4,042,861 A | * | 8/1977 | Yasuda et al. ............... | 361/783 |
| 4,064,689 A | | 12/1977 | Yasuda et al. | |
| 4,236,240 A | | 11/1980 | Yoshida | |
| 4,658,331 A | * | 4/1987 | Berg ........................... | 361/387 |
| 4,862,153 A | * | 8/1989 | Nakatani et al. ............. | 340/719 |
| 5,042,709 A | * | 8/1991 | Cina et al. ................... | 228/105 |
| 5,358,412 A | * | 10/1994 | Maurinus et al. ............. | 439/66 |
| 5,436,744 A | * | 7/1995 | Arledge et al. ................ | 359/82 |
| 5,450,221 A | * | 9/1995 | Owen et al. .................... | 349/58 |
| 5,606,440 A | * | 2/1997 | Kawaguchi et al. ......... | 349/150 |
| 5,670,994 A | * | 9/1997 | Kawaguchi et al. ......... | 349/150 |
| 5,803,341 A | | 9/1998 | Abe | |
| 6,045,368 A | * | 4/2000 | Cadenhead et al. ......... | 361/749 |
| 6,111,629 A | * | 8/2000 | Matsuhira et al. .......... | 349/150 |
| 6,116,493 A | * | 9/2000 | Tanaka ......................... | 29/729 |
| 6,198,518 B1 | * | 3/2001 | Kuga ............................ | 349/71 |
| 6,307,751 B1 | * | 10/2001 | Bodony et al. .............. | 361/749 |
| 6,358,065 B1 | * | 3/2002 | Terao et al. ................... | 439/67 |

FOREIGN PATENT DOCUMENTS

| | | |
|---|---|---|
| EP | 911 678 | 10/1998 |
| JP | 411085045 A * | 3/1999 |
| WO | 94 28459 | 12/1994 |

OTHER PUBLICATIONS

Patent Abstracts of Japan, vol. 017, No. 539, Sep. 28, 1993 & JP 05 150254 Jun. 18, 1993.
Patent Abstracts of Japan, vol. 017, No. 416, Aug. 3, 1993 & JP 05 080316, Apr. 2, 1993.
Advanced Driver Packaging in Display Products, Nolan, R., *Information Display*, Palisades Institute for Research Services, No. 10, Jan. 1, 1996, pp. 13–15.

* cited by examiner

*Primary Examiner*—Vit Miska
*Assistant Examiner*—Jeanne-Marguerite Goodwin
(74) *Attorney, Agent, or Firm*—Sughrue Mion, PLLC

(57) ABSTRACT

The display module (30) includes at least one liquid crystal cell (2) electrically and mechanically connected to a flexible display control printed circuit (1) having, arranged to a single face, electronic components for controlling the cell and metal paths for connection to the components and to said cell (2). In order to make it, the printed circuit (1) is first placed on the back side of the cell (2), the face of the printed circuit with no components facing the back of the cell (2), the printed circuit (1) is positioned under the cell (2), a mechanism for assembling the module (12) defining the location of the display of the cell (2), being made on the printed circuit (1) for the positioning thereof with respect to a display marking device (13) arranged on the cell and a portion of the face of the printed circuit with no components is secured directly to the back of the cell (2). The assembly mechanism of the printed circuit allows the module to be placed precisely on a complementary mechanism (41) of an apparatus case (40), for example a wristwatch case, accommodating it to have the liquid crystal cell in a determined position in the case.

18 Claims, 5 Drawing Sheets

METHOD FOR MAKING A DISPLAY MODULE INCLUDING A LIQUID CRYSTAL AND A SINGLE-FACE PRINTED CIRCUIT, AND MODULE OBTAINED VIA SAID METHOD

BACKGROUND OF THE INVENTION

The present invention concerns a method for making a display module including at least one liquid crystal cell connected to a control printed circuit for the display whose electronic components for controlling the cell and whose metal connection paths to said components and said cell are arranged on a single face. The invention also concerns a display module which can be obtained according to the method, as well as a watch including a display module.

DESCRIPTION OF THE PRIOR ART

Liquid crystal displays are used in various fields, for example for calculators or for devices displaying various data, which are linked to one or more printed circuits with electronic components for controlling the electrodes of the cell. Sometimes, several electronic components for controlling the cell are placed on a plate of the cell which also carries the conductive pads connected to the electrodes. Usually, the surface defined by the cell connected to the display control printed circuit or circuits located next to the cell is often too large to be able to be placed in a case of an apparatus of small dimensions, in which it is necessary to have compact display modules.

The printed circuits for said cells are usually rigid and more often their metal output pads are electrically connected to the respective conductive pads of the liquid crystal cell by zebra connectors inserted between said pads. The contact pressure necessary for this type of connection induces a certain mechanical tension between the cell, its support and the printed circuit, which may be a drawback. No great importance is generally attached to the location of the printed circuit, whether it is below or next to the liquid crystal cell to be connected. It is only in modular embodiments that the printed circuit is usually placed below the cell with, in this case, said zebra connectors forming part of the spacer elements.

U.S. Pat. No. 5,358,412 discloses a modular embodiment as mentioned above. The display module includes a module frame for enclosing a liquid crystal cell, a spacer element and a rigid printed circuit including all the electronic control components for said cell. The printed circuit can be a single-face printed circuit on which a zebra connector forming part of the spacer element is compressed in the frame to connect on one side the metal output pads of the printed circuit and on the other side conductive pads connected to the electrodes of the liquid crystal cell. The display module is mechanically and electrically connected to a flexible printed circuit in particular to supply said module with electricity. The electric connection between this flexible printed circuit and the module occurs on the surface of the rigid printed circuit carrying metal output paths of the module. No glue is used to maintain the electric connection, but the end of the flexible circuit is pressed between the spacer element and the metal output paths arranged on the rigid printed circuit.

In one embodiment, said flexible printed circuit includes two openings which fit onto two pillars of the rigid printed circuit to allow, in particular, precise positioning for the electric connection. It is to be noted that the frame is used for mounting all the elements of said module, as well as for connecting the flexible printed circuit to said module.

Given that, in one embodiment of said module, all the metal paths and all the cell control components are arranged on a single face of the rigid printed circuit in the direction of the back of the cell, a gap inevitably remains between the electronic components and the back of the liquid crystal cell. Likewise, in the event that the components are placed on an opposite face of the rigid printed circuit, gap remains because a connecting bar is used between metal pads arranged in this case on the back of the rigid printed circuit and respective metal pads of the liquid crystal cell.

The use of flexible circuits including metal paths, as well as liquid crystal cell control electronic components is also known. U.S. Pat. No. 5,469,412 discloses an analogue watch for detecting nuclear radiations. A flexible double face printed circuit is described. Two tongues carrying metal pads are directly connected to respective conductive pads of two liquid crystal display cells without using zebra connectors. This circuit is positioned under a frame including the watch movement, while the tongues are bent so that the liquid crystal cells are placed on this frame. Another part of the flexible printed circuit is connected to the watch detector and bent in order to be placed under an intermediate plate in an opposite direction to the cells.

Japanese Pat. No. 56031684, which concerns a design for a liquid crystal cell watch may also be cited. In this document, it may be noted that the single-face flexible printed circuit is first electrically connected to said cell without zebra connectors, then bent in the shape of an accordion under said cell. This type of construction creates a certain difficulty for mounting the assembly in a watch case so as to guarantee proper positioning of said display. In order to do this, one has to use a frame in which the liquid crystal cell is housed in order to have a display which is well centred with respect to the watch case.

SUMMARY OF THE INVENTION

The object of the present invention is to obviate the drawbacks of the aforementioned display modules. It proposes manufacturing a compact display module of small thickness, arranged so that the module can be easily and precisely mounted in a case of an apparatus in order for the display to be in a determined position. Said module can be mounted in particular in a wristwatch case.

One embodiment solution for said module consists in placing the printed circuit on the back side of the cell, in positioning it so that module assembly means made on the printed circuit define, with respect to display marking means arranged on the cell, the location of the liquid crystal cell, and in securing the face of the printed circuit which has no components on the back of the cell according to the characteristic part of claim 1.

Another embodiment solution for said module consists in placing the printed circuit on the back side of the cell, in fixing the face of the printed circuit which has no components on the back of the liquid crystal cell, and in forming means for assembling the module on the printed circuit, positioned with respect to display marking means arranged on the cell, so that they define the location of the cell display according to the characteristic part of claim 2.

One of the advantages of the module obtained via this method, which is the subject of the invention, is that the thickness of the cell with the single-face printed circuit, whose face which has no components is directly secured to the back of said cell to make it compact, is reduced to a minimum so as to be able to be mounted, for example in a digital watch of small thickness. It is of course clear that this thickness is largely dependent upon that of said cell which is a component obtained on the market and whose thickness is close to 1 mm. One may envisage in the near future obtaining such cells with a thickness of less than 1 mm.

Another advantage of the module according to the invention is that, because the printed circuit has all the electronic components and metal paths on a single surface of said printed circuit, the manufacturing costs are reduced to a minimum by avoiding the creation of metallised holes through the printed circuit to establish an electric connection of the metal paths and the components which would be arranged on both faces. Mounting of the electronic components on the printed circuit is also facilitated. Moreover, the arrangement of the metal paths is achieved so that said paths do not intersect over the entire printed circuit. The output terminals of the integrated circuit for controlling the cell therefore accord with the respective cell terminals to be contacted so that the metal paths from the output terminals of the integrated circuit do not intersect up to the connection to the cell.

Given that the electric connection of the printed circuit with the cell is achieved without intermediate elements, in particular without zebra connectors, the spacing between the pads or metal connection terminals of the printed circuit, and between the conductive paths of the cell may be reduced. The spacing, i.e. the pitch which is the added width of a path and a gap, could thus be less than 0.5 mm, and even less than 0.3 mm, but this depends on what is currently provided on the market by way of liquid crystal cells. With this reduced spacing, one can position precisely the tongue of the circuit carrying the metal pads for connection to the cell above the respective conductive pads of the cell and connect said pads electrically using an anisotropic conductive adhesive material which only becomes conductive when it is compressed and heat is applied thereto.

The method for making a display module, the module obtained according to the method, as well as the watch including such a module will be explained in more detail hereinafter by non-limiting embodiments represented with reference to the annexed drawings.

DETAILED DESCRIPTION OF REFERRED EMBODIMENT

The following description relates to the making of a display module for a digital wristwatch, but the use of such a module is of course not limited to watchmaking; it could also be used in other fields where it is necessary to make said module compact, with a small thickness and easily to mount precisely in an apparatus case as a result of assembly means on the printed circuit, while guaranteeing good positioning of the display.

Figure 1A:
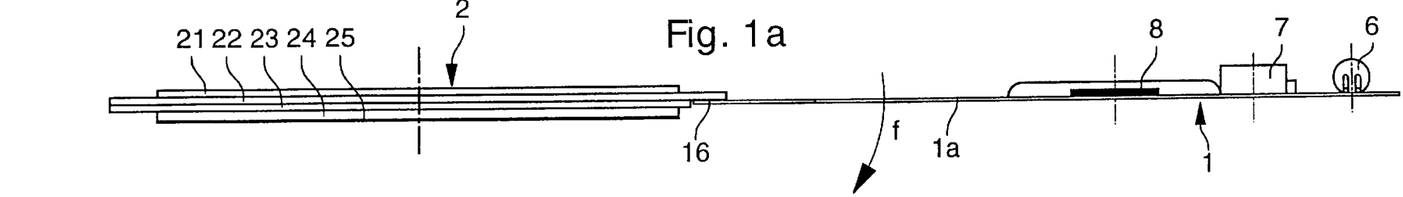
FIGS. 1a and 1b show side and top views of the display module after the electrical connection step between the cell and the printed circuit.
Figure 1B:
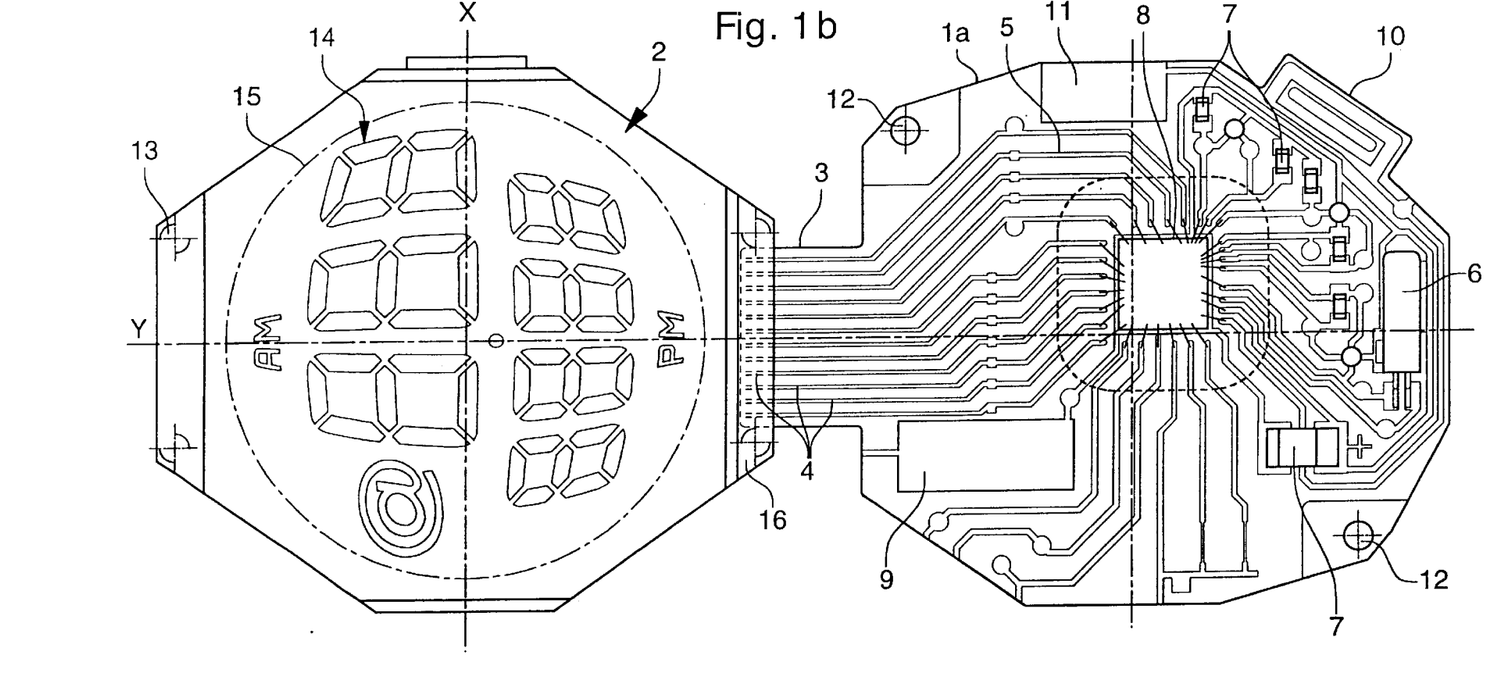
Figure 2A:
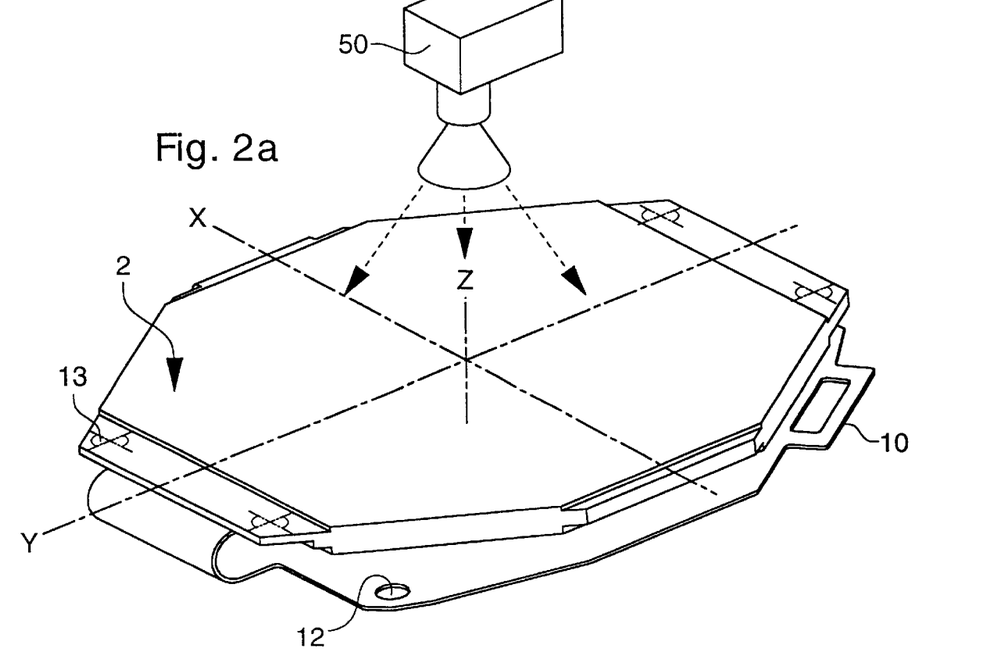
FIGS. 2a and 2b show top and bottom views of the module in axonometric perspective during the step of placing and positioning the printed circuit on the back side of the cell.
Figure 2B:
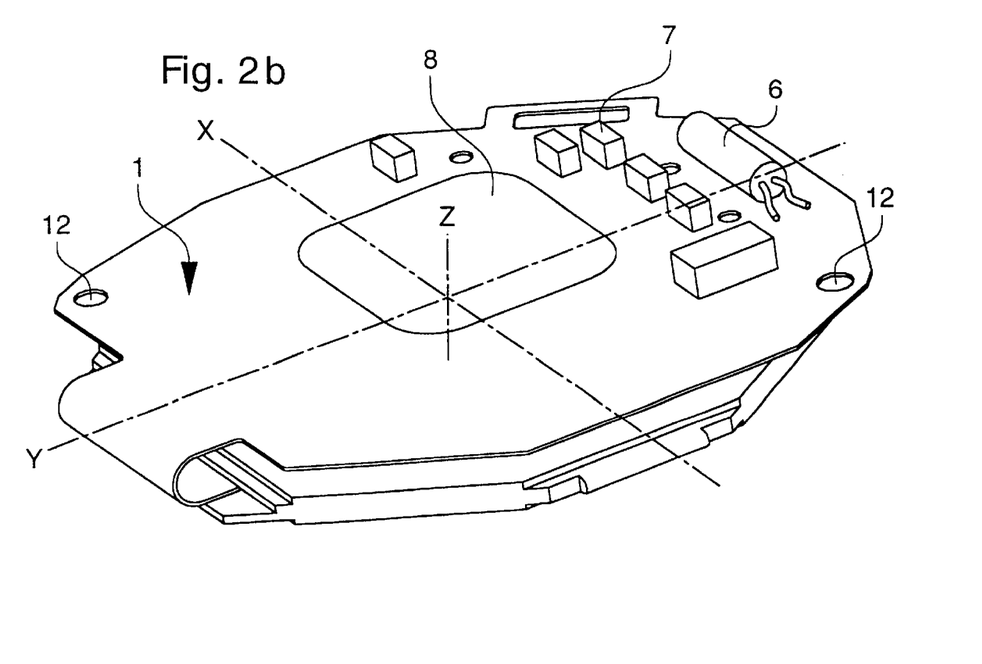
Figure 3A:
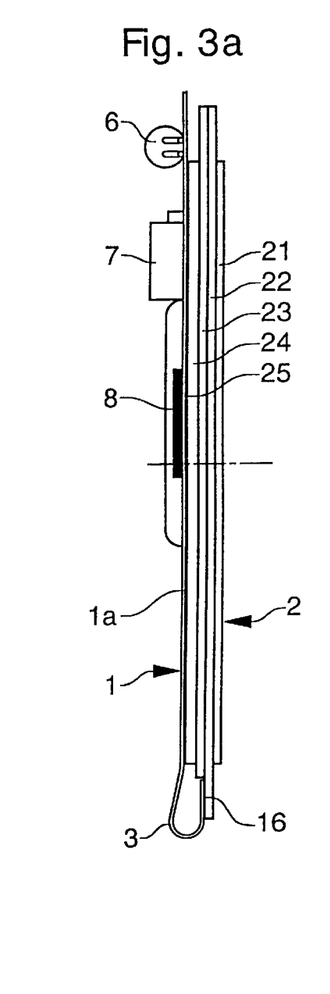
FIGS. 3a and 3b show side and top views of the display module in the state in which the printed circuit is secured in a state positioned on the back of the cell.
Figure 3B:
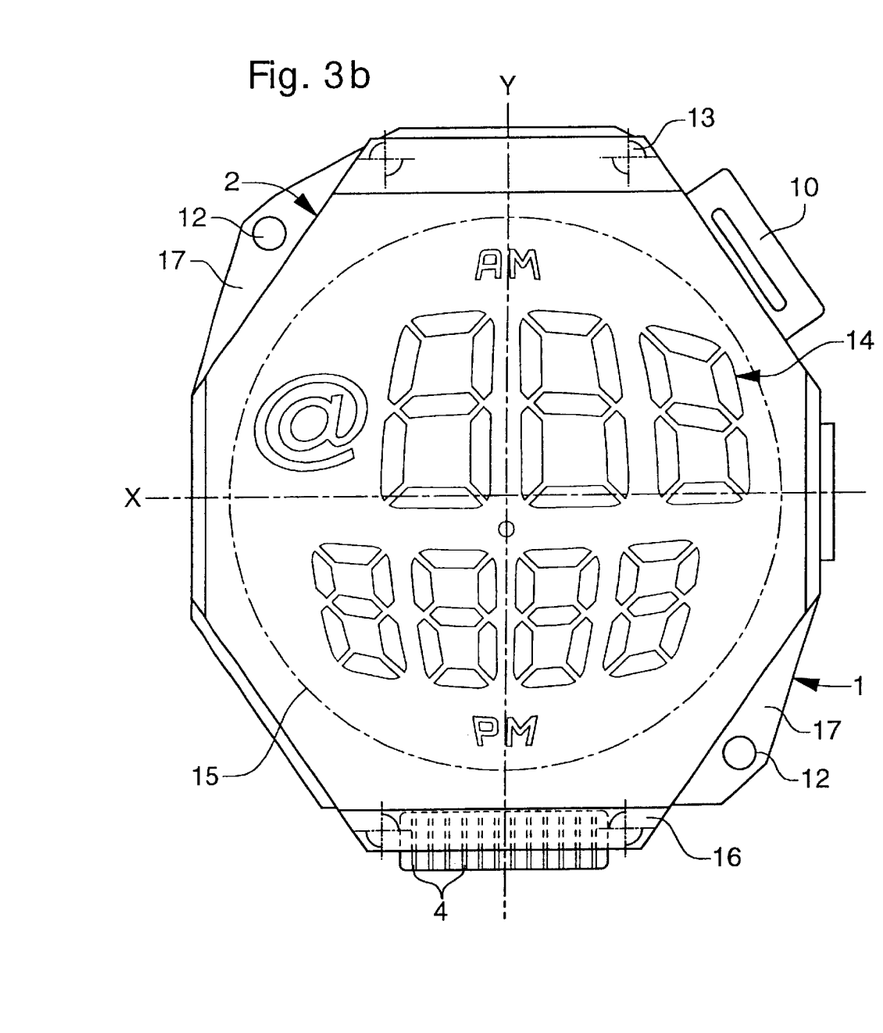

As can be seen in FIGS. 1 to 3, the display module includes a flexible printed circuit 1 having a substrate 1 a made of polyimide or polyester with a thickness of less than or equal to 150 $\mu$m, preferably 75 $\mu$m, and at least one liquid crystal display cell 2.

Flexible printed circuit 1 includes on a single face metal paths 5 connecting liquid crystal cell 2 and the electronic components, namely a quartz resonator 6, resistors and capacitors 7 and an integrated circuit 8 for controlling the LC cell. At one of the ends, it includes a tongue 3 carrying metal pads 4 for connection to liquid crystal cell 2. These metal pads 4 may or may not be regularly spaced and are placed in parallel beside each other as a function of the conductive pads arranged in the same manner with equivalent spacing under an extension 16 of first plate 22 of liquid crystal cell 2. A metal terminal 9 is provided for the power supply contact from the negative pole of a battery. A metal terminal 11 allows the contact of a connection blade of the metal bottom plate of the back cover of the watch case, this bottom plate being connected to the positive pole of the battery. A metal terminal 10 is also provided which can be bent and adhered against an edge of the cell to be used as contact for a control blade 43 actuated by a push-button 42, visible in FIGS. 4a and 4b, in order to display on the cell the various time and date data, as well as for setting times and dates. It is to be noted that it is not indispensable to bend this portion of the printed circuit carrying terminal 10, since control blade 43 could very well slide under the printed circuit and contact terminal 10 underneath.

Integrated circuit 8 is made so that metal paths 5 connecting the outputs of integrated circuit 8 with the conductive pads to be connected and discrete components 6 and 7 mounted on printed circuit 2 do not intersect.

Because liquid crystal cell 2 comes from a sheet which includes several cells to be separated from each other, this means that the location of display 14 cannot be precisely located, this is why targets 13, as marking and optical alignment means, are provided to locate its location precisely. The printed circuit also includes module assembly means positioned with respect to targets 13 of the cell whether in an optical or mechanical manner by using assembly means to move the printed circuit. This positioning of the printed circuit with respect to the cell may of course operate with other marking means or other targets placed on said circuit visible for example via transparency. In this case, the targets or marking means are aligned optically in a perfectly precise manner.

The final assembly means are two holes 12 arranged on two lugs 17 placed at the ends of a diagonal of the printed circuit. Once the module is finished, the two holes 12 allow said module to be mounted precisely laterally on two studs 41 of the watch case, visible in FIGS. 4a and 4b in order to have a display of the cell in a perfectly determined and precise position.

The shape of holes 12 is not necessarily circular. One hole may be oval and the other circular.

Liquid crystal cell 2, which can be of the nematic type (TN), includes a polariser film 21 secured onto first plate 22. The second plate 23 is secured under first plate 22. The two plates are shaped so as to enclose the liquid crystals between them. A last film acting as polariser/reflector 24 is secured under second plate 23 to allow the polarisation and reflection of the light entering from polariser film 21 on the side of display 14. The conductive pads of the cell, arranged on an extension 16 of first plate 22, end transparent control electrodes for display 14 which are arranged in lines and in columns on first plate 22 and second plate 23, not visible in the FIGS. The thickness of such a cell is less than 1.1 mm, each plate having a thickness of less than or equal to 0.3 mm and the polariser film having a thickness of less than 0.2 mm.

The shape of the cell is for example octagonal so as to be able to be mounted in a circular wristwatch case with a portion 15 visible from the exterior of a diameter close to 20 mm, shown in dotted lines in FIGS. 1 to 3, under the watch crystal, but it is of course clear that the shape of the cell could also be rectangular for mounting in a rectangular case.

Several steps of the method will be described with reference to FIGS. 1 to 3 for the construction of the display module.

Flexible printed circuit 1 is provided, in accordance with current techniques, with a spool, not shown in the FIGS., onto which is wound a tape including several printed circuits arranged one after the other on said tape, of which only metal paths 5, made in particular of copper, are made on a single face. It is important to design everything on one face only, since this avoids the need to make metallised holes for creating electric connection passages from one face to the other, by way of economy and to facilitate the mounting of the electronic components.

By pulling on said strip, one or more printed circuits 1 are placed in position to be able to mount electronic components 6, 7 and 8 on each single-face printed circuit before or after cutting the series of identical printed circuits out of the tape. Consequently, tongues 3 of printed circuits 1 can be arranged perpendicularly to the longitudinal axis of the tape, i.e. with respect to one of the edges of the tape. This mounting may be automated as is usual to the knowledge of those skilled in this field.

Although several printed circuits may be pulled from said tape at the same time, purely for the sake of simplification, the description will be made in the case where a single printed circuit is pulled from said tape with the electronic components mounted before or after it is cut out of said tape without thereby being limited to this particular case.

Once all the electronic components 6 and 7 have been mounted and integrated display control circuit 8 has been mounted and encapsulated on printed circuit 2, metal pads 4 of printed circuit tongue 3 are connected to the corresponding pads of liquid crystal cell 2. The face of printed circuit 1 with no components is first of all held on a plane surface for this step of the method.

A strip of anisotropic conductive adhesive material is placed either on the ends of metal pads 4 of the printed circuit, or on the conductive pads of cell 2 prior to this connection. Extension 16 of first plate 22 of cell 2 carrying the conductive pads is brought above metal pads 4 at the end of tongue 3 with the anisotropic adhesive strip interposed, the metal and conductive pads facing each other.

One may use for example a camera placed above the cell for aligning and positioning said pads respectively facing each other via transparency of extension 16 of first plate 22. Targets 13 which are four in number, provided as marking means on plate 22 may also be used by the camera to position said tongue, but given the transparency of the edge of first plate 22 of the cell and the visibility of the conductive pads under the glass, targets 13 are not deemed necessary at this step of the method.

For the mechanical and electric connections of the cell and the printed circuit, extension 16 of first plate 22 is pressed against tongue 3 by heating for the adhesion, for example to a temperature around 180° C. Said anisotropic adhesive material is formed of a thermosetting resin with conductive powder incorporated therein. It only becomes conductive when it is compressed. Given that the metal and conductive pads are parts which project over the printed circuit and over the extension with empty spaces between each pad, the adhesive material is only compressed between each metal pad 4 connected to the respective conductive pad of cell 2. However, in the empty spaces between the conductive pads and the empty spaces between the metal pads, the adhesive material will remain insulating. The connection of each metal pad with each conductive pad occurs over a distance which varies from 1 mm to 2 mm.

The centre to centre spacing of the metal pads located on tongue 3 is equivalent to the spacing of the conductive pads to be connected of cell 2. Previously, with the use of zebra connectors the spacing was around 0.5 mm. With this connection without said bars, it is possible to reduce this spacing to less than 0.3 mm without creating a short circuit between said pads. The width of a metal pad is of the order of 0.15 mm and the space separating two neighboring pads is of the order of 0.15 mm. The spaces and the pads are not necessarily of equal size.

The result of this step of the method is shown in FIGS. 1*a* and 1*b*. Arrow f indicates the subsequent bending direction at 180° of printed circuit 1 which has to be placed on the back of cell 2.

In the following step of the method, visible in FIGS. 2*a* and 2*b*, an artificial vision device 50 is used for positioning the printed circuit with respect to the cell. An image of cell 2 with targets 13, defining the location of display 14 (FIG. 1*b*) is stored before the printed circuit is bent above the cell. In order to do this, the display side of cell 2 is held on a plane surface in a support arrangement. Afterwards, flexible printed circuit 1, held by a suction tool, is bent so that it is located parallel in a spaced positioned above the back of the cell, the face with no components facing the back of said cell. The area of the printed circuit is slightly larger than that of the cell, which means that during positioning in X and Y, it practically covers the said cell completely.

The printed circuit, including two holes 12 as means for assembly to the module, is moved along axes X and Y parallel to the back of the cell so as to position it with respect to stored targets 13 defining the location of display 14 of liquid crystal cell 2. For positioning the printed circuit with respect to targets 13, one uses as a marker either the module assembly means, which are the two holes 12 made in two lugs 17, or the stored printed circuit image, knowing that according to this image the position of holes 12 is well defined with respect to the location of the liquid crystal cell.

Normally a movement along Y can be sufficient in the this step of the method if the X positioning has already been performed in the step for connecting tongue 3 under extension 16 of first plate 22 of cell 2.

Once the X and Y positioning of the printed circuit has been achieved with respect to the finished cell, the flexible printed circuit has to be moved along the Z axis towards the back of the cell where a strip of adhesive material 25 (FIG.

1a) having a thickness of around 50 μm, has been placed beforehand covering all of back 24 of said cell. As soon as the printed circuit face with no components is pressed against the strip of adhesive material, the display module is finished, as shown in FIGS. 3a and 3b. The two lugs 17 are not adhered and remain free. Seen from the top of said module in FIG. 3b, the two lugs 17 of the printed circuit with two holes 12 for mounting the module in the watch case overruns the periphery of the cell.

In a slightly different embodiment, holes 12 of printed circuit 1 may be made at the end of the manufacturing method for said module instead of being already present initially. In this case, the flexible printed circuit face with no components is adhered underneath the cell, leaving two portions in the shape of printed circuit lugs 17 accessible after adhesion. Afterwards, a tool perforates each of the two holes 12 in lugs 17 as a function of the location of display 14 using targets 13 stored by artificial vision device 50.

It is possible to use any shaped assembly means different from the holes discussed hereinbefore, for example two studs which are secured to or made on the printed circuit for mounting the module in an apparatus case having complementary means for accommodating the printed circuit studs, but this complicates the manufacture of said module.

One may also envisage placing printed circuit 1 first of all parallel to the back of cell 2, the printed circuit face with no components facing the back of the cell, positioning the printed circuit along X and Y as a function of the cell image, then moving the printed circuit along Z to adhere it to the back of the cell. The module assembly means are made before or after securing the two elements.

Subsequently, printed circuit tongue 3 is connected underneath extension 16 of first plate 22. In order for such an operation to succeed once the printed circuit is already adhered to the back of the cell, the tongue can be made with a central opening, metal paths 5 ending in the shape of metal connection pads 4 having to pass around the opening. A strip of anisotropic adhesive material is placed either on the end of the metal pads of tongue 3, or on the conductive pads of the cell. The tongue opening is provided so that tongue 3 can be pressed and heated with a tool once positioned, in order to connect it electrically and mechanically to the conductive pads of the cell underneath said extension 16.

The marking means used for positioning printed circuit 1 with cell 2 could be formed, instead of by targets 13, by the display itself, if the cell were supplied with electricity.

Figures 6, 7:
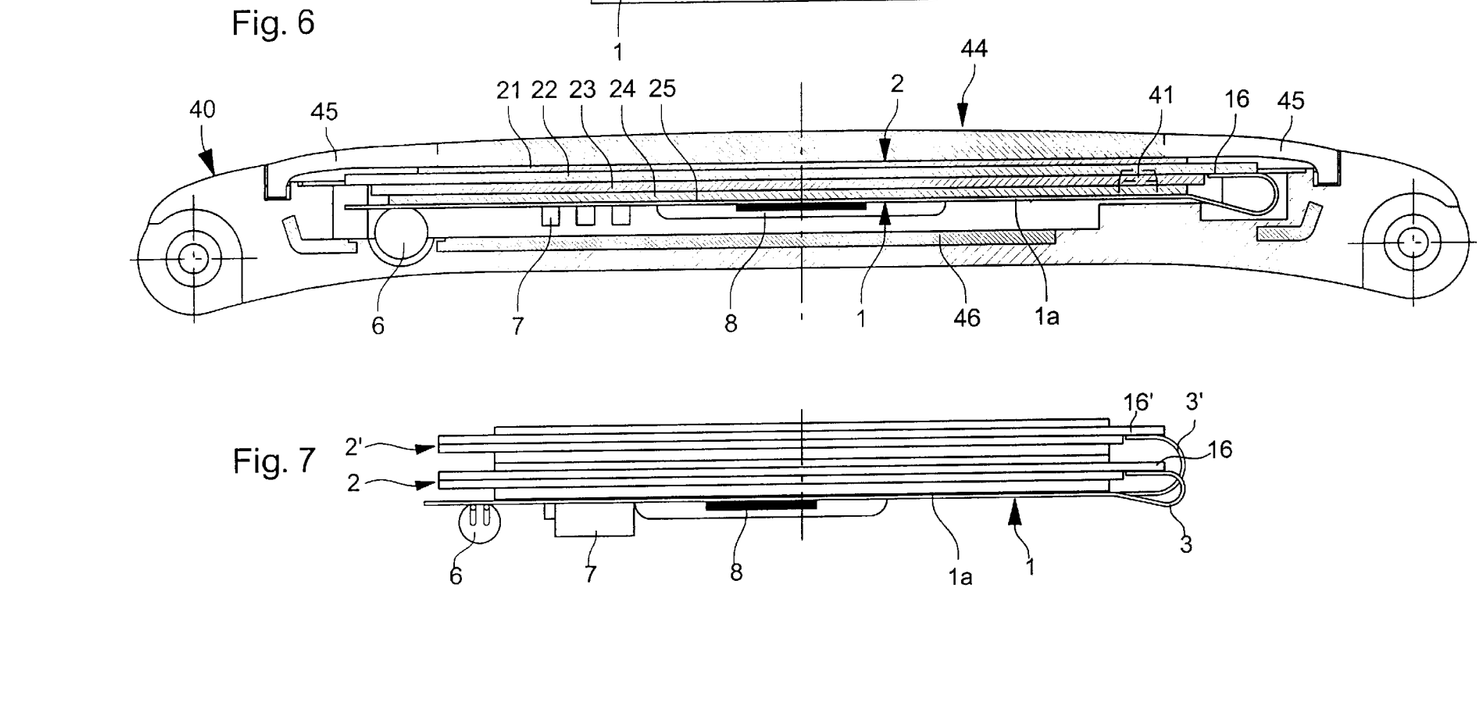
FIG. 6 shows a vertical cross-section of the watch with its display module mounted.
FIG. 7 shows a side view of the display module with two liquid crystal cells.

In the event that one wishes to use two liquid crystal cells 2 and 2' mounted one on top of the other, the method steps are the same as described hereinbefore. The two series of conductive pads underneath extensions 16 and 16' of each of the cells are offset along axis X so as not to be superposed seen from above.

Printed circuit 1 includes two tongues 3 and 3' arranged one beside the other each carrying metal pads 4 for connection to the conductive pads of the corresponding cell. A strip of adhesive material is placed either on extensions 16 and 16' of each of the cells, or on tongues 3 and 3'. As soon as tongues 3 and 3' are positioned on the conductive pads of each of the cells, they are pressed and heated in order to be secured, as explained hereinbefore.

Once this step is finished, the printed circuit at 180° is bent in the region of the tongues so as to be located parallel at a certain distance from the back of the second cell, and positioned on X and Y, prior to being moved along axis Z to be adhered to a strip of adhesive material 25 placed under the second cell. Tongue 3' connecting the first cell has a larger radius of curvature than tongue 3 connecting the second cell.

Of course, when the module with two cells is made, tongues 3 and ' may be secured underneath extensions 16 and 16' of first plates 22 of the cells after the printed circuit face with no components has been positioned and secured to the back of the second cell.

Figure 4A:
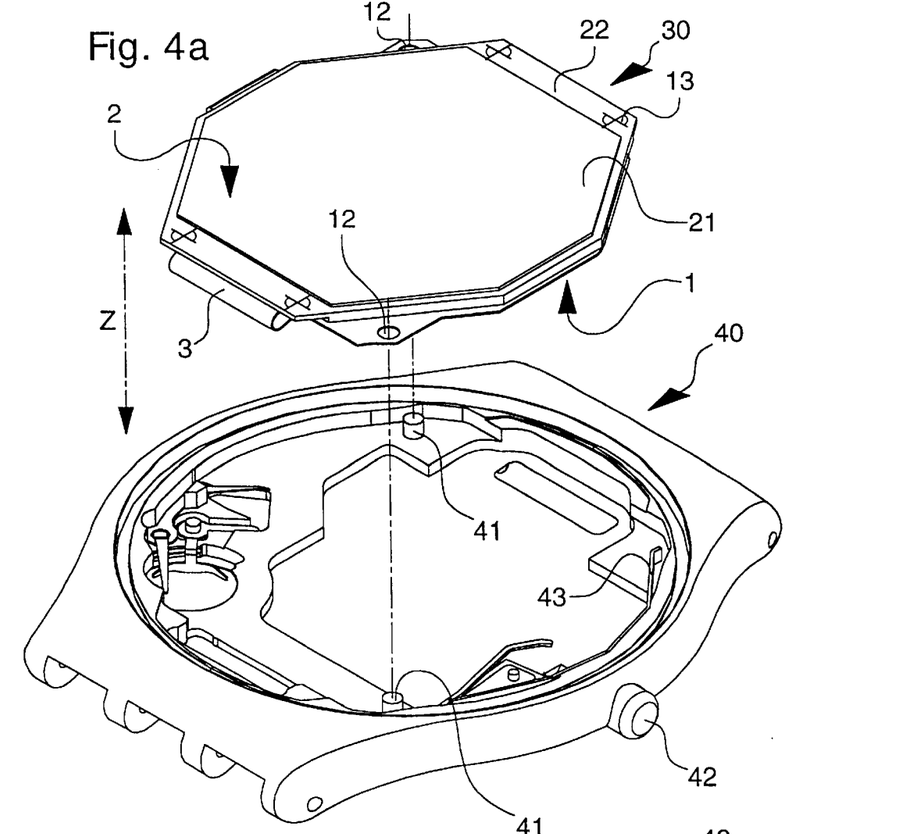
FIGS. 4a and 4b show two axonometric perspective views of the display module before and after the mounting thereof in a watch case.
Figure 4B:
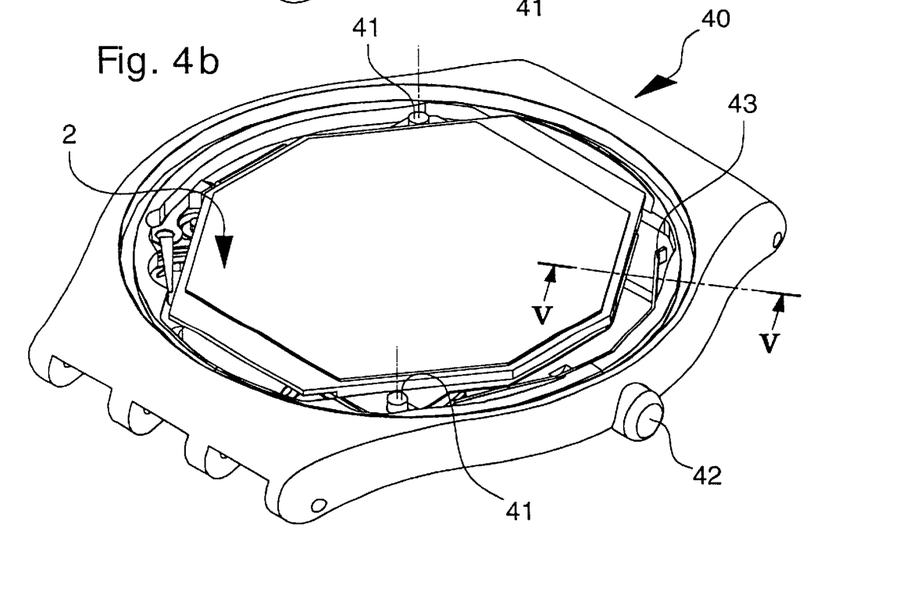

FIGS. 4a and 4b show the mounting of display module 30 in a watch case 40. The two holes 12 made in the printed circuit allow said module to be held and positioned in its own plane easily and precisely in said case 40 on two studs 41, integral with the moulded plastic case. Once placed on the two studs, the module allows a display to be positioned laterally in the watch case with a precision of less than 100 μm. Once introduced into the case, module 30 is sealed to the case by deforming via heating, or by ultrasound or by other deformation means, the top portion of studs 41.

The liquid crystal cell can rest on four supports of the case once the module is placed on studs 41. However, said module may also be secured to the back cover of the case without using cell supports, in order to reduce the thickness of the watch further by approximately 3.9 mm. It should be noted that the thickness of the module, of the order of 2.7 mm is dependent upon the thickness of cell 2 and also on that of quartz resonator 6 and discrete components 7.

Figure 5:
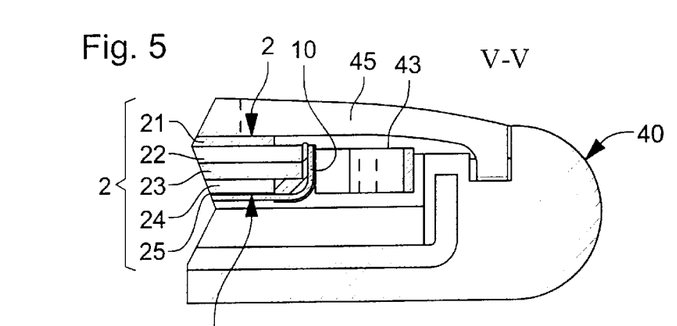
FIG. 5 shows a partial vertical cross-section along the line V—V of FIG. 4b of the watch with the module provided with a connection terminal on the printed circuit for the electric contact of a control blade.

FIG. 5 shows only a portion of the flexible printed circuit which is bent and adhered to an edge of the cell, said portion carrying a metal terminal 10 for the contact of a flexible control conductive blade 43 pushed by a push-button 42, visible in FIGS. 4a and 4b. By pressing push-button 42, different liquid crystal cell modes can be selected, and the time and date of the watch can be set.

FIG. 6 shows a vertical cross-section of the finished watch assembly with its display module 30. The crystal 44 of the watch includes a peripheral ring 45 which is opaque to conceal the edges of the cell and the elements of the back cover of case 40, so that only portion 15 (FIG. 1b) of the display remains visible. The case is moulded in plastic with a metal back cover bottom plate 46 connected to the positive pole of the battery.

The invention which has just been described is of course not limited to the wristwatch display module embodiment, but covers any display module, within the reach of those skilled in the art, having assembly means, made on the printed circuit secured to the back of the cell and positioned with respect to the location of the display, to facilitate the mounting thereof on complementary means made in the device accommodating it.

What is claimed is:

1. A method for manufacturing a display module including at least one liquid crystal cell connected to a display control flexible printed circuit, said printed circuit having, arranged on a first face, electronic components for controlling the liquid crystal cell and metal paths for connection to said electronic components and to said liquid crystal cell via one end in the form of a flexible tongue of said printed circuit, wherein the method includes the steps of:

placing the printed circuit on a back side of the liquid crystal cell, a second face of the printed circuit with no components facing the back side of the liquid crystal cell, positioning the printed circuit with respect to the liquid crystal cell, said printed circuit including module assembly means so that, during positioning of the printed circuit with respect to display marking means arranged on the liquid crystal cell, said assembly means define the location of the display of the liquid crystal cell, and securing a portion of the second face of the printed circuit with no components directly to the back side of said liquid crystal cell.

2. A method for manufacturing a display module including at least one liquid crystal cell connected to a display control flexible printed circuit, said printed circuit having, arranged on a first face, electronic components for controlling the liquid crystal cell and metal paths for connection to said electronic components and to said liquid crystal cell via one end in the form of a flexible tongue of said printed circuit, wherein the method includes the steps of:
  placing the printed circuit on a back side of the liquid crystal cell, a second face of the printed circuit with no components facing the back side of said liquid crystal cell,
  securing a portion of the second face of the printed circuit with no components directly to the back side of said liquid crystal cell, and
  making module assembly means on the printed circuit, positioned with respect to marking means arranged on the liquid crystal cell, so that said assembly means define the location of the display of the liquid crystal cell.

3. A method according to claim 1 or 2, wherein metal pads of the printed circuit which are arranged on said one end are connected to corresponding conductive pads of the liquid crystal cell arranged on one of plates of said liquid crystal cell, and wherein the printed circuit is bent at 180° in the region of the tongue to be placed on the back side of the liquid crystal cell.

4. A method according to claim 3, wherein the module is formed of two liquid crystal cells the first liquid crystal cell of which is secured above the second liquid crystal cell, said printed circuit being secured to the back side of the second liquid crystal cell, and wherein the printed circuit includes two tongues placed one next to the other on the same end, each carrying a series of metal pads for the electric and mechanical connection of the printed circuit to the conductive pads of the respective first and second liquid crystal cells, the two series of conductive pads not covering each other when seen from above.

5. A method according to claim 3, wherein the metal pads of the printed circuit are connected to respective conductive pads of the liquid crystal cell by applying a strip of anisotropic conductive adhesive material on the conductive pads or on the metal pads, by placing the tongue or tongues facing a respective plate extension carrying said conductive pads so as to align each metal pad in superposition with each corresponding conductive pad, and by compressing and heating the tongue or tongues against the face of the respective plate to establish the electric connection between said metal pads and conductive pads, said adhesive material being conductive solely between the metal pads compressed against the respective conductive pads, the adhesive material remaining insulating in the empty spaces between the metal pads and in empty spaces between the conductive pads, the conductive pads of the tongue or tongues having a center-to-center spacing of less than 0.5 mm, and each metal pad having a width less than 0.2 mm.

6. The method according to claim 5, wherein said spacing is equal to 0.3 mm, and said width is equal to 0.15 mm.

7. A method according to claim 1 or 2, wherein, in a final step, said one end is bent at 180° and secured so as to connect metal pads of the printed circuit arranged on the tongue to corresponding conductive pads of the liquid crystal cell arranged on one of plates of said liquid crystal cell.

8. A method according to claim 1 or 2, wherein an entire surface of the back of the liquid crystal cell is secured, onto the second face of the printed circuit with no electronic components, by using a strip of adhesive material.

9. A method according to claim 1 or 2, wherein the module assembly means are two holes made in two lugs of the printed circuit extending beyond a surface of the back side of the liquid crystal cell.

10. A method according to claim 1 or 2, wherein one edge of the printed circuit carrying a metal contact terminal is bent at 90° and adhered to an edge of the liquid crystal cell.

11. A display module, for a wristwatch, manufactured by the method of claims 1 or 2, said module including at least one liquid crystal cell connected to a flexible display control printed circuit, said printed circuit having, arranged on a first face, electronic components for controlling the liquid crystal cell and metal paths for connection to said electronic components and to said liquid crystal cell, wherein one portion of a second face of the printed circuit with no components is secured and positioned directly on the back side of the liquid crystal cell, wherein the printed circuit includes module assembly means defining the location of the display of the liquid crystal cell with respect to display marking means of the liquid crystal cell, wherein one end of the printed circuit in the form of a tongue carrying a series of metal pads for connection to said liquid crystal cell is bent at 180° and mechanically and electrically connected to respective conductive pads of the liquid crystal cell.

12. A module according to claim 11, wherein the metal pads on the tongue and respective conductive pads of the liquid crystal cell are connected by means of a strip of anisotropic conductive adhesive material which is only conductive between the metal pads compressed against the respective conductive pads, the adhesive material remaining insulating in empty spaces between the metal pads and in the empty spaces between the conductive pads.

13. A module according to claim 11, wherein the printed circuit is adhered over an entire surface of the back side of the liquid crystal cell which includes a top polariser and three plates, a back plated onto which the printed circuit is adhered, is of the reflector/polariser type.

14. A module according to claim 11, wherein one edge of the flexible printed circuit carrying a metal contact terminal is in a bent state and adhered to an edge of the liquid crystal cell.

15. A watch including a display module according to claim 11, wherein a watch case includes complementary assembly means co-operating with the module assembly means for the lateral positioning of said module so that the display of the liquid crystal cell is in a determined position in the watch case.

16. A watch according to claim 15, wherein the complementary assembly means are two studs rising vertically from a back cover of the watch case co-operating with the module assembly means which include two holes arranged in two lugs extending beyond a surface of the back side of the liquid crystal cell.

17. A method according to claim 1, wherein metal paths of the printed circuit, which connect electronic components and said cell, do not intersect.

18. A module according to claim 11, said module being formed of two liquid crystal cells the first cell of which is secured above the second cell, the flexible printed circuit being secured to the back of the second cell, and wherein the printed circuit includes two tongues placed one next to the other on the same end of the printed circuit, each carrying a series of metal pads for the electric and mechanical connection to the conductive pads of the respective cells, the two series of conductive pads not covering each other when seen from above.

* * * * *